United States Patent
De Jong et al.

(10) Patent No.: US 8,653,847 B2
(45) Date of Patent: Feb. 18, 2014

(54) TESTABLE INTEGRATED CIRCUIT, SYSTEM IN PACKAGE AND TEST INSTRUCTION SET

(75) Inventors: Fransciscus G. M. De Jong, Valkenswaard (NL); Alexander S. Biewenga, Eindhoven (NL)

(73) Assignee: NXP, B.V., Eindhoven (NL)

( * ) Notice: Subject to any disclaimer, the term of this patent is extended or adjusted under 35 U.S.C. 154(b) by 322 days.

(21) Appl. No.: 13/110,408

(22) Filed: May 18, 2011

(65) Prior Publication Data

US 2011/0267093 A1 Nov. 3, 2011

Related U.S. Application Data

(62) Division of application No. 11/996,320, filed as application No. PCT/IB2006/052490 on Jul. 20, 2006, now Pat. No. 7,948,243.

(30) Foreign Application Priority Data

Jul. 22, 2005 (EP) ..................................... 05106761

(51) Int. Cl.
*G01R 31/26* (2006.01)
(52) U.S. Cl.
USPC ................................ 324/762.03; 324/762.01
(58) Field of Classification Search
USPC ............... 324/537, 765, 76.11, 73.1; 714/720
See application file for complete search history.

(56) References Cited

U.S. PATENT DOCUMENTS

| | | | |
|---|---|---|---|
| 4,860,290 A | 8/1989 | Daniels et al. | |
| 5,673,276 A | 9/1997 | Jarwala et al. | |
| 5,677,913 A | 10/1997 | Aybay | |
| 6,804,725 B1 | 10/2004 | Whetsel | |
| 2007/0146004 A1 * | 6/2007 | Park et al. | 326/30 |

FOREIGN PATENT DOCUMENTS

| | | |
|---|---|---|
| GB | 1 536 147 | 12/1978 |
| JP | 7-287053 A | 10/1995 |
| JP | 2001-166002 A | 6/2001 |
| WO | 03/025595 A2 | 3/2003 |
| WO | 2005/022177 A1 | 3/2005 |

OTHER PUBLICATIONS

Written Opinion for Int'l. Patent Appln. No. PCT/IB/2006/052490, Jul. 20, 2006.
International Search Report for Int'l. Patent Appln. No. PCT/IB/2006/052490, Dec. 8, 2006.

* cited by examiner

*Primary Examiner* — Vincent Q Nguyen

(57) ABSTRACT

Consistent with an example embodiment, there is integrated circuit (IC) die responsive to a reset signal. The IC die includes a detector coupled to a power supply of the die for generating the reset signal in response to the detection of a voltage increase of the power supply. Coupled to the detector, a reset signal output, coupled to the detector, provides the reset signal to an external device.

3 Claims, 4 Drawing Sheets

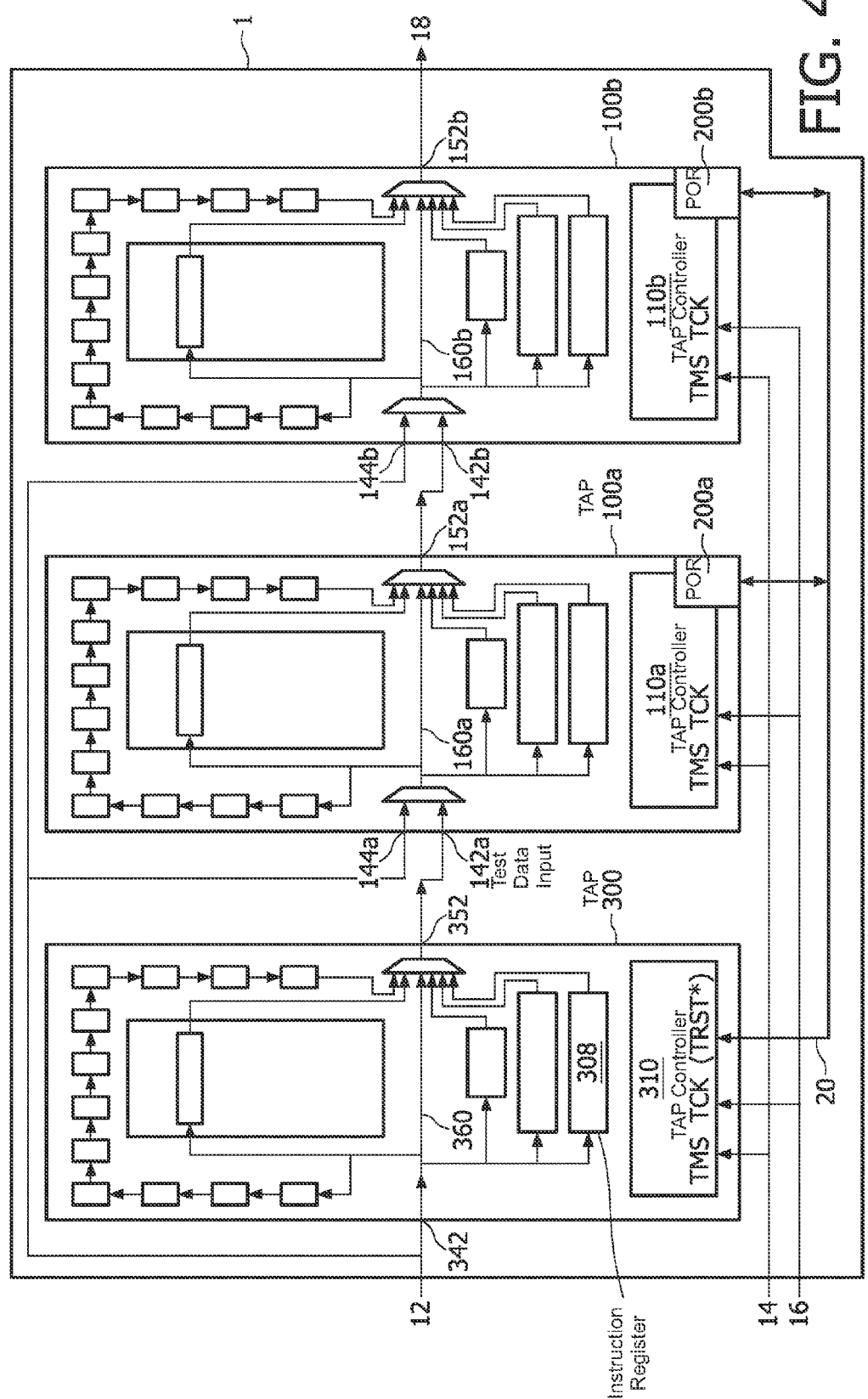

TESTABLE INTEGRATED CIRCUIT, SYSTEM IN PACKAGE AND TEST INSTRUCTION SET

CROSS-REFERENCE TO RELATED APPLICATIONS

Figure 1:
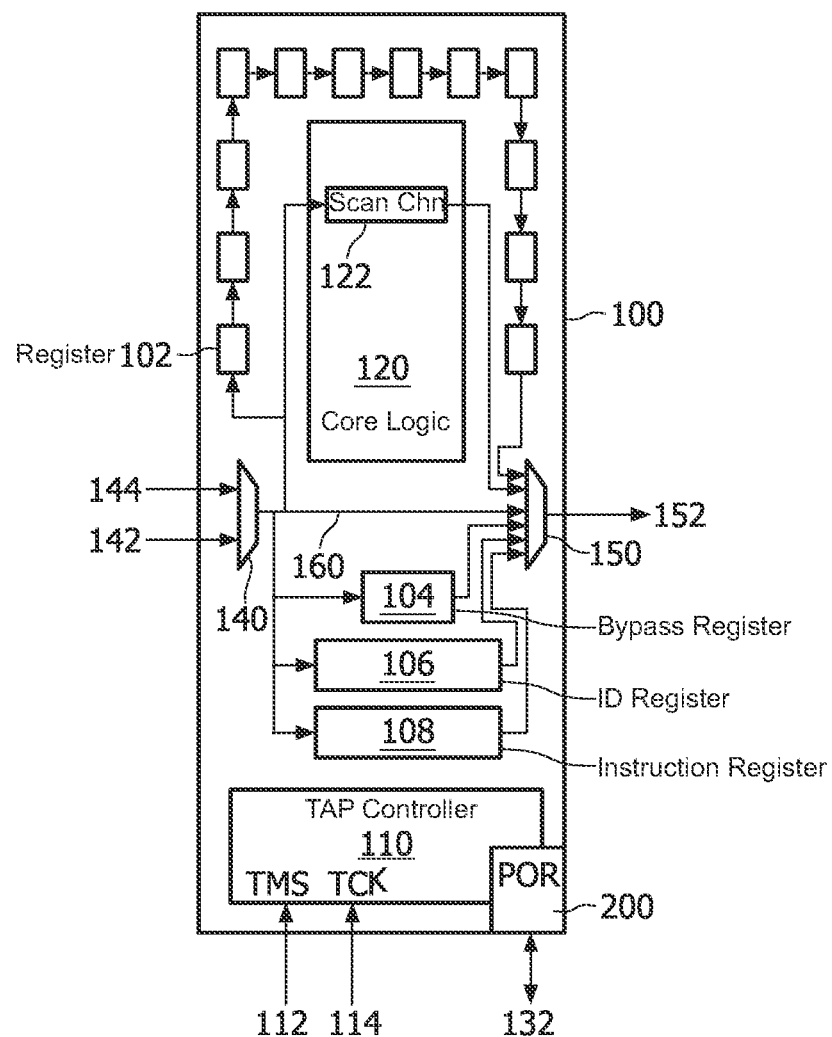

This application is a division of U.S. patent application Ser. No. 11/996,320, filed on Nov. 14, 2008, which is the national stage of international patent application no. PCT/IB2006/052490, filed on Jul. 20, 2006, which claims the priority of European patent application no. 05106761.9, filed on Jul. 22, 2005, the contents of each of which are incorporated by reference herein.

The present invention relates to an integrated circuit die including a test arrangement.

The present invention further related to a system in package including such an integrated circuit die.

The present invention yet further relates to an instruction set for operating the test arrangement.

Integrated circuit (IC) testing has become an integral part of the IC manufacturing process. Moreover, the increasing complexity of ICs has led to the testing part of this process becoming more and more dominant in terms of cost. This is one of the reasons why globally accepted, i.e. standardized, test methods for ICs have emerged, since they facilitate the addition of standard test arrangements to an IC, which, amongst others, reduces test cost.

A popular example of such a standardized test method is the IEEE 1149.1 standard, which is also known as boundary scan test (BST) or the joint test access group (JTAG) test. According to BST, an IC is extended with a test access port (TAP) under control of a TAP controller. The TAP comprises a plurality of shift registers such as an external test or boundary scan register, a bypass register and an instruction register coupled between a test data input (TDI) and a test data output (TDO), with the TAP controller being in charge of selecting the appropriate register in response to an instruction loaded into the instruction register via TDI. Optionally, the TAP controller is further responsive to a test reset (TRST) signal to ensure that the test arrangement is in a well-defined state at the beginning of testing the IC.

In order to comply with the BST standard, a number of design rules have to be observed for the test arrangement on board an IC. For instance, a JTAG device may have only a single TAP, and must have a bypass register consisting of a single cell, i.e. data storage element such as a latch or a flipflop, length. Moreover, if the optional identification register is present in the TAP, this register should have a fixed length of 32 cells.

These design rules pose complications for devices in which more than one IC are present, such as a system in package (SiP). In a SiP, a number of different IC dies are present, which typically are mounted on a passive substrate before the aggregate is concealed in a single package. Because each IC die may come from a different source, each die may have its own independent test arrangement. These test arrangements may comply with the JTAG constraints on an individual basis, but in cooperation, the aggregate of test arrangements is likely to breach the aforementioned JTAG compliancy rules, because the SiP is seen as a single JTAG device. For instance, the test path through the various test arrangements leads to a multitude of TAPs having an aggregate bypass register length of more than a single cell, both breaching the JTAG compliancy rules for a single JTAG device.

U.S. Pat. No. 6,804,725 discloses a multiple IC arrangement that can be accesses via a single TAP. To this end, hierarchy is added to the arrangement by having a system level TAP through which all IC level TAPs are accessible, with only the system level TAP being connected to the external test signal pins of the multiple IC arrangement. Although this arrangement is JTAG compliant, it is not ideal for SiP testing. First of all, an additional TAP is required, which adds to the area overhead of the SiP. Moreover, the interconnect structure between the system level TAP and the IC level TAPs is relatively complex, which increases the chances of interconnect faults between them.

The present invention seeks to provide an IC die having a test arrangement that can be used in a SiP in a JTAG compliant way without the need for an additional TAP.

The present invention also seeks to provide a SiP that can be tested in a JTAG compliant way without the need for an additional TAP.

The present invention further seeks to provide an instruction set for facilitating such SiP testing.

According to a first aspect of the invention, there is provided an integrated circuit die as claimed in Claim 1. This IC die has the advantage that when combined with one or more other ICs, the second data input may be selected, which for instance facilitates bypassing the test arrangements of the other ICs, in which case only a bypass register of the test arrangement of the IC according to the present invention will be observed on the outside of an aggregate of ICs. Preferably, the test arrangement comprises a JTAG compliant TAP and TAP controller.

Advantageously, the test arrangement further comprises a signal path bypassing said shift registers between the multiplexer and the further multiplexer. The presence of such a signal path facilitates unclocked data transfer through the test arrangement, which is particularly advantageous when another test arrangement of another IC is used for debugging purposes, in which case the test result data from the other IC can be quickly transferred to the outside of the aggregate of ICs via the unclocked signal path.

In an advantageous embodiment, the test arrangement is responsive to a test reset signal, the die further comprising a detector coupled to a power supply of the die for generating the test reset signal in response to the detection of a voltage increase of the power supply. This ensures that on power-up or after a voltage drop compromising the state of the IC, the test arrangement is reset to a well-defined, initial state. The detector may be inhibited by an inhibition signal to prevent the generation of unwanted reset signal, for instance when the test arrangement has entered a low-voltage testing mode.

Preferably, the plurality of interconnects include a test reset signal output coupled to the detector. This facilitates the output of the test reset signal to the test arrangements of other IC dies that do not have their own reset generating facilities. Moreover, it may obviate the need for an external test reset signal, which means that the external pin count of a device including the IC die of the present invention may be reduced.

The plurality of interconnects may further comprise a further reset signal input, the die further comprising a logic gate for generating an output signal in response to the further reset signal input and the reset signal, the test arrangement being responsive to the output signal. This has the advantage that the test arrangement can be reset by both its internally generated reset signal as well as by an external reset signal, e.g. a reset signal from another IC die. To this end, the plurality of interconnects may comprise a bidirectional interconnect comprising the test reset signal output and the further test reset signal input to reduce the pin count required for the IC die of the present invention.

In another embodiment, the plurality of shift registers includes an identification (ID) register comprising a plurality of register cells, a subset of said plurality of register cells being coupled to means for programming said subset with a predefined bit pattern. This facilitates (partial) redefinition of the identification code in the ID register, for instance by coupling the subset of cells to respective fuses, write only memory, one time programmable memory or respective additional bond pads that are tied to ground or the supply voltage ($V_{dd}$) depending on the value of the bit to be stored in the subset cell.

At this stage, it is pointed out that throughout this application, the abbreviation $V_{dd}$ is used for the power supply by way of non-limiting example only. Moreover, the phrase 'IC die' is used to emphasize the different origins of the ICs that form a part of a SiP. Typically, the different ICs originate from different wafers, which leads to a collection of different dies, e.g. pieces of silicon from different origins, inside the SiP. The use of the phrase 'IC die' is not intended to delimit from the phrase 'IC'; both phrases are intended to refer to the same or similar products.

According to a further aspect of the present invention, there is provided a system in package as claimed in claim 10. The SiP of the present invention has the advantage that the presence of an IC die according to the present invention facilitates a JTAG compliant SIP. For instance, when the bypass mode is chosen for a JTAG SiP, the test arrangement of the IC die of the present invention, which will then include a bypass register and which is typically the last test arrangement in the chain of test arrangements on the SiP, selects its second test data input in combination with its bypass register, which means that all the test arrangement of the first IC, and in general, the test arrangements of all preceding ICs are bypassed, thus rendering the aggregate length of the bypass register in the test arrangement of length 1 in compliance with the JTAG requirements.

Advantageously, the test arrangement of the further integrated circuit die further comprises a signal path bypassing said shift registers between the multiplexer and the further multiplexer. This facilitates unclocked data transfer through the test arrangements. The other test arrangements on board the SiP may have similar signal paths to maximize speed and flexibility of the data transfer configurations.

It is a further advantage if the test arrangement of at least one die from the plurality of integrated circuit dies is responsive to a test reset signal, the at least one die comprising a detector coupled between the test arrangement and a power supply of the at least one die for generating the test reset signal in response to a voltage increase of the power supply. This obviates the need for the provision of a test reset signal from a source external to the SiP to the at least one die. The detector may be responsive to an inhibition signal for inhibiting the generation of the test reset signal.

Preferably, the at least one die further comprises a test rest signal output coupled to the detector, the plurality of integrated circuit dies further comprises another die having a test arrangement responsive to the test reset signal, the another die having a test reset signal input coupled to the test reset signal output of the at least one die. By linking the detector to other reset responsive test arrangements on board the SiP, the detector can generate a system level reset, which obviates the need for the provision of a test reset signal from a source external to the SiP to any of the dies of the SiP, in which case the SiP system level interconnects do not have to include a test reset input.

It is another advantage if the at least one die further comprises a further test reset signal input for receiving an external test reset signal and a logic gate having a first input coupled to the test reset signal output and a second input coupled to the further test reset signal input, the test arrangement of the at least one die being responsive to an output of the logic gate. This means that the test arrangement reset can also be triggered by a reset signal generated at another die. Consequently, if one of the dies observes an increase in voltage that may be caused by a power-up or the recovery from a voltage drop, thus indicating that the intended state of this IC die may no longer be present, this IC die can generate a reset signal for (itself and) the other IC dies to ensure that the test mode of the SiP remains in a defined state. To this end, the plurality of interconnects of the at least one die may comprise a bidirectional interconnect comprising the test reset signal output and the further test reset signal input to reduce the number of interconnects required for this die.

According to yet another aspect of the invention, there is provided a data storage medium as claimed in claim 16. The stored instructions include instructions that ensure that the second test data input of the IC die of the present invention is selected in case of a JTAG instruction that may cause a conflict with the JTAG standard, e.g. the BYPASS instruction.

It will be appreciated that the test reset signal generation arrangements of an IC die as disclosed in this application can be applied to SiPs having a plurality of IC dies that may have any test arrangement, e.g. built-in self test arrangements or non-JTAG test arrangements. Moreover, the reset signal may also be used for resetting one or more IC dies of the SiP in normal, i.e. functional, mode. The advantages mentioned above for the test signal generation means described in conjunction with a JTAG compliant test arrangement similarly apply to these alternatives.

Figure 2:
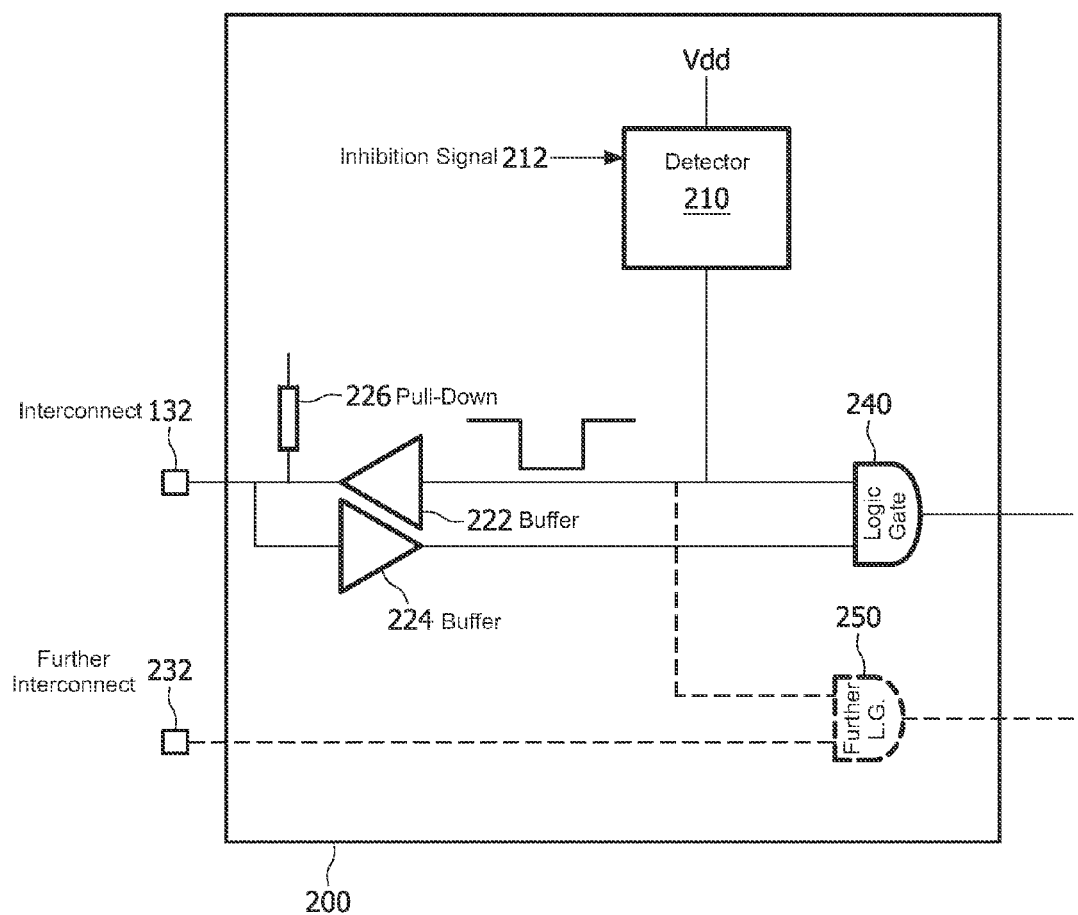
Figure 3:
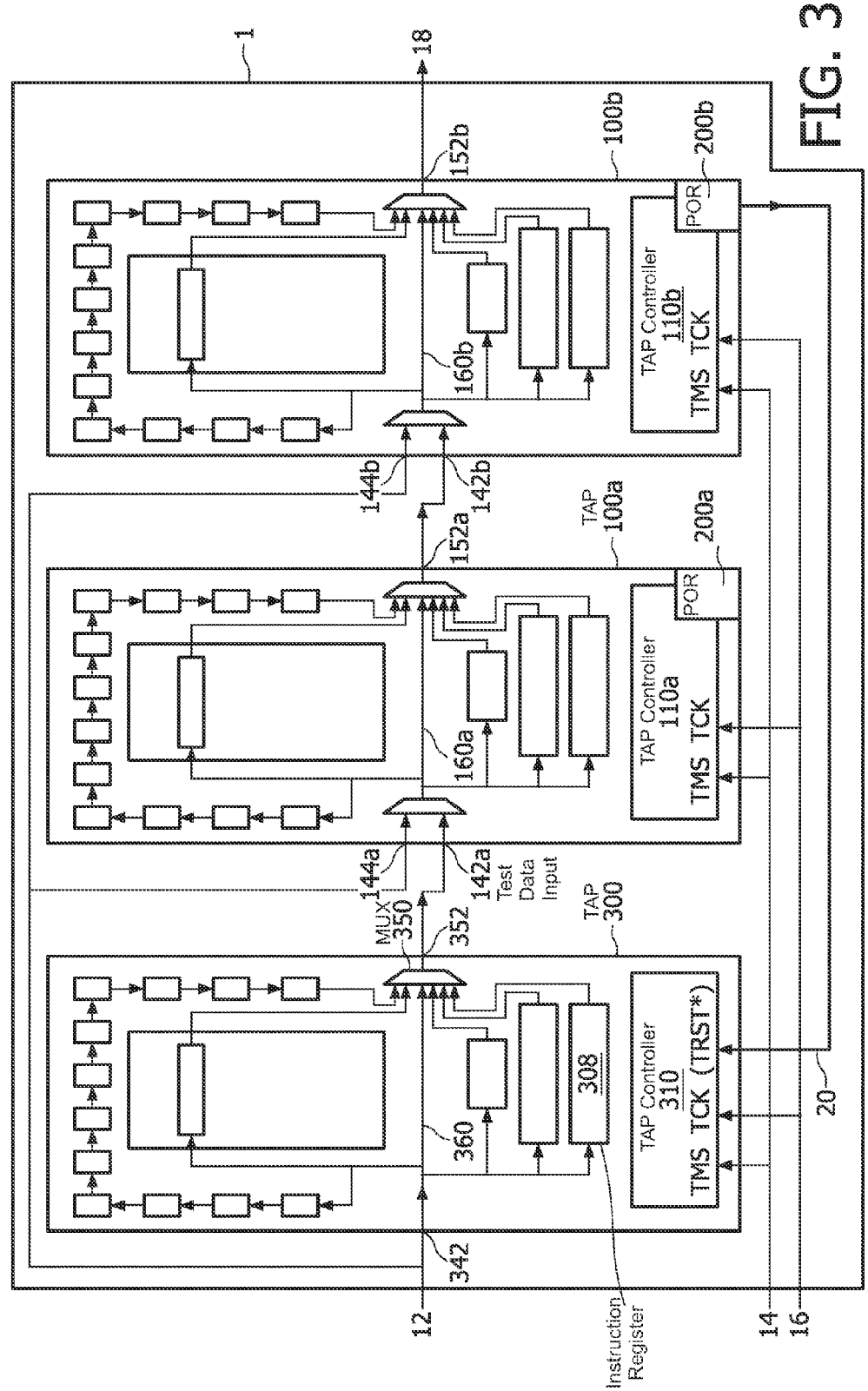

The invention is described in more detail and by way of non-limiting examples with reference to the accompanying drawings, wherein:

FIG. 1 schematically depicts an IC die having a test arrangement according to the present invention;

FIG. 2 shows a detail of an IC die according to the present invention;

FIG. 3 schematically depicts an embodiment of a SiP having IC dies with test arrangements including an IC die according to the present invention; and FIG. 4 schematically depicts another embodiment of a SiP having IC dies with test arrangements including an IC die according to the present invention.

It should be understood that the Figures are merely schematic and are not drawn to scale. It should also be understood that the same reference numerals are used throughout the Figures and their detailed description to indicate the same or similar parts.

The IC die shown in FIG. 1 has a test arrangement including a test access port (TAP) 100 and a test access port controller 110. The TAP 100 includes a plurality of shift registers, such as a boundary scan or extest register 102, a bypass register 104, an optional identification register 106, which typically carries an identification code of the IC die, and an instruction register 108. Other registers may be present, such as one or more scan chains 122 that are used to feed test patterns into the core logic 120 of the IC die. The TAP 100 further comprises a first multiplexer (MUX) 140 and a further MUX 150 under control of the TAP controller 110. The first MUX 140 is arranged to receive a first input 142 and a further input 144 via respective interconnects of the IC die, whereas the further MUX 150 is arranged to output a test data output (TDO) signal via another interconnect of the IC die.

A signal path 160 is present between the first MUX 140 and the further MUX 150, which bypasses the various shift registers in the test arrangement of the IC die. The signal path 160 is a direct, i.e. unclocked, signal path facilitating fast data transfer through the test arrangement of the IC die, which is particularly advantageous for debug purposes, as will be explained in more detail later. The TAP controller 110 is responsive to the JTAG mandated test mode select (TMS) signal 112 and the test clock (TCK) signal 114, which are typically received via respective interconnects of the IC die. The IC die may be responsive to the optional JTAG test reset (TRST) signal, which is also typically provided via an interconnect of the IC die. Alternatively, the TAP controller, or the test arrangement as a whole, may be responsive to an internally generated reset signal from a power-on reset (POR) circuit 200. The POR circuit 200 may be an integral part of the test arrangement of the IC die or may be conductively coupled to the TRST input (not shown) of the TAP controller 110. In addition, the POR circuit 200 may be coupled to a reset signal output 132 of the IC die, in order to make the reset signal available to external devices.

FIG. 2 shows an embodiment of the POR circuit 200. The POR circuit 200 has a detector 210 coupled to a power supply of its IC die, as indicated by line Vdd. The detector 210 is arranged to detect an increase in power, e.g. voltage, in the power supply. Such an increase in power is typically associated with a power-up of the IC die or with the power recovery after a substantial power loss, e.g. voltage drop, of the IC die, the latter being an indication of a risk that the data integrity of the IC die has been jeopardized, which may require a reset of the (test) circuit. In response to the detection of the power increase, the detector 210 generates a reset signal, e.g. a test reset signal that may be forwarded to the TAP controller 110 of the test arrangement of the IC die to reset the test arrangement. Such a reset may take place in accordance with the reset mechanism of a JTAG compliant TAP controller 110, although this is not strictly necessary. The (test) reset signal may only be generated if the increase in power measured by the detector 210 exceeds a predefined threshold, to avoid accidental resets due to power fluctuations within acceptable limits. The detector 210 may further be responsive to an inhibition signal 212 for inhibiting the generation of the (test) reset signal.

Optionally, the (test) reset signal may be made available on an interconnect 132 of the IC die to facilitate resets of external devices in response to the generated reset signal. This is particularly useful if the IC die is one of a number of devices in a system, e.g. a system in package (SiP), for which a system-wide reset has to be present. In such a scenario, the IC die also has to be responsive to a reset signal generated on an external device. To this end, the POR circuit 200 may comprise a logic gate 240, e.g. an OR gate, which is arranged to receive the (test) reset signal generated by the detector 210 as well as a further test reset signal received by the IC die from an external device. The further test reset signal may be received on a separate interconnect of the IC die (not shown). Alternatively, the interconnect 132 may be a bidirectional pin, which is arranged to output the test reset signal from the detector 210 and to receive the further test reset signal from the external device. The bidirectional pin may be implemented in any known way, e.g. with buffers 222 and 224 in both branches of the bidirectional pin. The output branch of the pin may be connected to a weak pull-up or pull-down element 226 to prevent the output of a floating value on the interconnect 132 in situations where the detector 210 does not generate a test reset signal. This prevents the erroneous resets of external devices that are responsive to the signals on interconnect 132.

Optionally, the reset signal generated by the detector 210 may also be used to reset the IC die in functional mode. The IC die may also be responsive to an external reset signal in functional mode; to this end, the POR circuit 200 may comprise a further logic gate 250, e.g. an OR gate, which has an input coupled to the detector 210 for receiving the reset signal generated by the detector 210, a further input coupled to a further interconnect 232 of the IC die for receiving a reset signal generated by a device external to the IC die, with the reset mechanism of the IC die being responsive to the output of the further logic gate 250.

FIG. 3 shows a SiP 1 including a number of IC dies according to the present invention. The SiP 1 is shown to have three dies by way of non-limiting example only. The SiP 1 has a number of system interconnects including a system test data input 12, a system test mode select input 14, a system test clock input 16 and a system test data output 18. The SiP 1 further has a first IC die with a test arrangement including a TAP 300 having a TAP controller 310. The TAP 300 is a standard JTAG compliant TAP, although advantageously a direct signal path between its test data input 342 and its multiplexer 350 may be present. The MUX 350 is controlled by the TAP controller 310 in response to the contents of instruction register 308 in accordance with the IEEE 1149.1 standard. The TAP 300 has its test data input 342 coupled to the system test data input 14.

The second IC die has a test arrangement including a TAP 100*a* having a TAP controller 110*a*. The TAP 100*a* is an embodiment of the TAP 100 shown in FIG. 1 and described in the detailed description thereof. The TAP 100*a* has its test data input 142*a* coupled to the test data output 352 of the TAP 300. The further test data input 144*a* of the TAP 300*a* is coupled to the system test data input 12. The third IC die has a test arrangement including a TAP 100*b* having a TAP controller 110*b*. The TAP 100*b* is also an embodiment of the TAP 100 shown in FIG. 1 and described in the detailed description thereof. The TAP 100*b* has its test data input 142*b* coupled to the test data output 152*a* of the TAP 100*a*. The further test data input 144*b* of the TAP 300*b* is coupled to the system test data input 12, with the test data output 152*b* of the TAP 300*b* being coupled to the system test data output 18. The IC dies having a TAP 100 according to the present invention have their second test inputs 144 directly coupled to the system test data input 12, thus bypassing previous TAPs in the chain of TAPs of the system-level test arrangement of SiP 1. The respective TMS and TCK inputs of TAP controllers 310, 110*a* and 110*b* are all responsive to the system TMS input 14 and the system TCK input 16 respectively.

The direct connection between the system test data input 12 and the further test data input 144*b* of the TAP 300*b* makes it possible that the SiP 1, despite having multiple TAPs, which is in disagreement with the JTAG requirement that a device may only have a single TAP, can still be tested in a JTAG compliant manner. The BST instructions can be divided into two categories: a first category in which the length of an involved register in a TAP has to be known to an external test device, and a second category in which the length of the involved register is defined in the standard, e.g. the size of a bypass register 104 has to be exactly one cell.

For instructions of the first category, the TAP controllers 110*a* and 110*b* will select respective first test data inputs 142*a* and 142*b*, in which case the length of the associated register will be defined as the concatenation of the associated registers in TAPs 300, 110*a* and 110*b*, e.g. the concatenation of the boundary scan registers in EXTEST mode. To an external test device, SiP 1 will behave like there is only a single TAP present on the SiP 1, as mandated by the JTAG standard.

For instructions of the second category, the TAP controllers 110*a* and 110*b* will select respective further test data inputs 144*a* and 144*b*. This has the effect that the test data outputs of all TAPs in the chain prior to the last TAP in the chain are being ignored. The system test data input 14 is directly fed into TAP 100b, which is the last TAP in the chain of TAPs inside the SiP 1. As long as the register lengths of the registers of the TAP 100b, e.g. the bypass register 104 having a length of a single cell, the test arrangement of the SiP 1 will again behave in compliance with the JTAG standard because only the compliant registers of the TAP 100b are included in the test data path.

At this point, it will be appreciated that although the IC die having a TAP 100a in FIG. 3 is shown as an embodiment of an IC die according to the present invention, this die may actually be a die having a known TAP, e.g. an embodiment of TAP 300. In fact, in order to provide a SiP 1 according to the present invention, only the last IC die in the chain of IC dies needs to have a TAP 100 according to the present invention to facilitate the bypass of all previous TAPs in the chain in order to comply with JTAG requirements, as previously explained.

The respective direct signal paths 360, 160a, and 160b in the TAPs 300, 100a and 100b are especially advantageous for debugging the SiP 1. For instance, if the IC die having TAP 100a has to be debugged, the TAP 300 and the TAP 100b can be loaded with an instruction that triggers their respective TAP controllers to select respective direct signal paths 360 and 160b. Consequently, the TAP 100a is coupled to system test data input 12 via an unclocked path through TAP 300 and to system test data output 18 via an unclocked path through TAP 100b, thus enabling fast data transfer between the IC die under debug and external debug devices. As an alternative, the bypass path around TAP 300 via the second data input 144a may be chosen to achieve similar I/O speeds for debugging this IC die.

In order to facilitate the selection of the further test data input 144 and the direct signal path 160 in an TAP 100 as shown in FIG. 1, the instruction set for operating the state machine of a TAP controller 110 has to be extended with instructions enabling such selections, examples of which are shown in the table below.

| Instruction | IEEE 1149.1 | Binary Code | Path | Selected Input |
|---|---|---|---|---|
| BYPASS | Yes | All-1 | 104 | 144 |
| CLAMP | Yes | Free | 104 | 144 |
| IDCODE* | Yes | Free | 106 | 144 |
| USERCODE* | Yes | Free | user ID | 144 |
| HIGHZ | Yes | Free | 104 | 144 |
| WIRE_BYPASS | No | Free | 160 | 144 |
| S_WIRE_BYPASS | No | Free | 160 | 142 |
| WIRE_CLAMP | No | Free | 160 | 144 |
| S_WIRE_CLAMP | No | Free | 160 | 142 |
| S_EXTEST | No | Free | 102 | 144 |

*denotes instruction related to selection of an optional register

Basically, the instructions including the JTAG compliant instructions have to be adapted to enable the discrimination between the test data input 142 and the further test data input 144. This can be realized by specifying a bit in the instruction or adding a bit to the instruction, which indicates which of the two inputs has to be chosen. In additions, instructions have to be added that facilitate the selection of the signal path 160. It will be appreciated that the extension of the functionality of the TAP controller 110 to facilitate this selection is straightforward, and will not be further explained for that reason. The instruction set may be stored on a data storage medium such as the memory of an external test device or a data carrier, e.g. CD-ROM.

If all TAP controllers in the SiP 1, i.e. TAP controllers 310, 110a and 100b in FIG. 3 include the optional TRST input, the SiP 1 may further have an additional interconnect (not shown) connected to these TRST inputs for providing all the TAP controllers with a global reset signal to ensure that in a system-level test mode a system-level reset is available, e.g. for starting up the system level test arrangements in a defined manner.

In reality, because the various IC dies inside the SiP 1 are likely to originate from different sources, not all dies will include the optional TRST input in their TAP controller, which means that another reset mechanism has to be provided. This is realized in FIG. 3 by the inclusion of a POR circuit 200a in the IC die comprising TAP 100a and the inclusion of a POR circuit 200b in the IC die comprising TAP 100b. The POR circuits 200a and 200b are embodiments of the POR circuit 200 shown in FIGS. 1 and 2 and described in the detailed description of these Figs. In the arrangement shown in FIG. 3, the IC die including POR 200b has an output coupled to POR circuit 200b for providing the TAP controller 310 with a test reset signal, e.g. upon power-up of the IC die including POR circuit 200b, via a conductive path, e.g. a reset signal bus 20. In general, the IC dies inside the SiP 1 that do not have a reset signal input for resetting their test arrangement need to have a POR circuit 200, whereas all IC dies that do have a reset signal input may either have this input connected to a POR circuit 200 internal to the die or to an external POR circuit 200.

In FIG. 3, the POR circuit 200a is not connected to the reset signal bus 20. This is a feasible embodiment for a SiP 1, because both circuits will generate a reset signal, and only one of these signals needs to be provided to IC dies external to these circuits.

FIG. 4 shows an alternative embodiment of a SiP 1, in which both the POR circuit 200a and the POR circuit 200b are bidirectionally coupled to the reset signal bus 20, e.g. via a bidirectional interconnect 132 as shown in FIG. 2. This is an especially advantageous embodiment if POR circuit 200a is responsive to a different power supply than POR circuit 200b. As soon as one of these circuits will generate a (test) reset signal, all IC dies connected to the reset signal bus 20 will be provided with this test reset signal, which ensures a controlled initialization of the system-level test arrangement of the SiP 1, e.g. in situations where various IC dies have different power-up speeds. In a situation where a functional mode reset is provided, it is important that the IC die having the slowest power-up speed is equipped with a POR circuit 200 to ensure that the system is initialized after the slowest link in the system has powered up. Also, in order to limit power consumption over the reset signal bus 20, it is preferred that only POR circuits 200 having substantially the same power supply voltages are connected to the reset signal bus 20 to avoid the flow of substantial quiescent currents over the bus.

It is pointed out that the SiP 1 may also include other IC dies (not shown) such as analog or mixed-signal dies that do not include a JTAG based TAP 100. Such dies may also be responsive to a POR circuit 200 of another die on board the SiP 1, and the signal provided by this POR circuit 200 may be a test reset signal, which may be used for initializing a built-in self-test or another test, or a functional mode reset signal.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit die responsive to a reset signal, comprising:
    a detector coupled to a power supply of the die for generating the reset signal in response to the detection of a voltage increase of the power supply,
    a reset signal output coupled to the detector for providing the reset signal to an external device; and
    a test arrangement responsive to the reset signal, the detector being coupled to the test arrangement.

2. A system in package comprising a first integrated circuit die as claimed in claim 1 and a further integrated circuit die being responsive to the reset signal, the further integrated circuit die including a reset signal input coupled to the reset signal output of the first integrated circuit die.

3. A system in package as claimed in claim 2, wherein the further integrated circuit die includes a further test arrangement responsive to the reset signal, the further test arrangement being coupled to the reset signal input.

* * * * *